United States Patent
Dallmann et al.

(10) Patent No.: US 10,720,200 B2
(45) Date of Patent: Jul. 21, 2020

(54) REDUCED LATENCY I/O IN MULTI-ACTUATOR DEVICE

(71) Applicant: Seagate Technology LLC, Cupertino, CA (US)

(72) Inventors: Devon Dallmann, Westminster, CO (US); Andrew Michael Kowles, Lyons, CO (US); Bruce Douglas Buch, Westborough, MA (US); Mark A. Gaertner, Vadnais Heights, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 15/962,756

(22) Filed: Apr. 25, 2018

(65) Prior Publication Data

US 2019/0333572 A1 Oct. 31, 2019

(51) Int. Cl.
*G06F 12/10* (2016.01)
*G11C 11/406* (2006.01)
*G11C 11/4096* (2006.01)

(52) U.S. Cl.
CPC ........ *G11C 11/40611* (2013.01); *G06F 12/10* (2013.01); *G11C 11/4096* (2013.01); *G06F 2212/1024* (2013.01); *G06F 2212/657* (2013.01)

(58) Field of Classification Search
CPC ........... G11C 11/40611; G11C 11/4096; G06F 12/10; G06F 12/0246; G06F 12/0223; G06F 12/0862; G06F 12/08; G06F 2212/1024; G06F 2212/657; G06F 2212/7201; G06F 2212/6028; G06F 3/0619; G06F 3/0655; G06F 11/1072

USPC .......................................................... 711/106
See application file for complete search history.

(56) References Cited

U.S. PATENT DOCUMENTS

| | | | | |
|---|---|---|---|---|
| 4,270,154 A * | 5/1981 | Crawford | ............... | G11B 5/012 360/137 |
| 5,261,058 A * | 11/1993 | Squires | .................. | G06F 3/0601 360/78.12 |
| 5,274,773 A * | 12/1993 | Squires | .................. | G06F 3/0601 710/38 |
| 5,526,328 A * | 6/1996 | Oshima | .................. | G06F 1/1626 369/13.02 |
| 5,909,691 A | 6/1999 | Schultz et al. | | |
| 6,307,705 B1 | 10/2001 | Anderson et al. | | |
| 6,411,459 B1 * | 6/2002 | Belser | ................. | G11B 5/59633 360/48 |
| 6,614,608 B1 * | 9/2003 | Belser | .................. | G11B 5/5965 360/135 |
| 6,735,032 B2 * | 5/2004 | Dunn | .................. | G11B 5/59633 360/31 |
| 7,102,842 B1 * | 9/2006 | Howard | ............... | G11B 5/5521 360/61 |

(Continued)

*Primary Examiner* — Mano Padmanabhan
*Assistant Examiner* — Jean C Edouard
(74) *Attorney, Agent, or Firm* — Holzer Patel Drennan

(57) ABSTRACT

An exemplary data refresh method disclosed herein reading data into volatile memory from a first storage region using a read element controlled by a first actuator assembly and writing the data from the volatile memory to a second storage region using a write element controlled by a second actuator assembly, where the first actuator assembly and the second actuator assembly are configured to receive data from control circuitry via independent read/write communication channels.

22 Claims, 6 Drawing Sheets

(56) References Cited

U.S. PATENT DOCUMENTS

| | | | |
|---|---|---|---|
| 7,116,513 B1* | 10/2006 | Sun | G11B 5/5582 360/77.02 |
| 8,749,910 B1* | 6/2014 | Dang | G11B 5/09 360/55 |
| 8,947,817 B1* | 2/2015 | Chung | G11B 5/09 360/55 |
| 9,830,939 B1 | 11/2017 | Hamilton | |
| 9,852,754 B1 | 12/2017 | Martin et al. | |
| 10,049,691 B1 | 8/2018 | Gaertner et al. | |
| 10,090,010 B1 | 10/2018 | Erden | |
| 2001/0005295 A1* | 6/2001 | Okuyama | G11B 5/5552 360/78.05 |
| 2001/0032292 A1* | 10/2001 | Hoskins | G11B 5/5521 711/112 |
| 2002/0103967 A1* | 8/2002 | Brower, Jr. | G06F 3/0611 711/114 |
| 2002/0181164 A1* | 12/2002 | Macken | B82Y 10/00 360/319 |
| 2003/0065872 A1* | 4/2003 | Edgar | G11B 20/1217 711/4 |
| 2003/0200393 A1* | 10/2003 | Cornaby | G06F 12/0862 711/118 |
| 2009/0154004 A1* | 6/2009 | Bedillion | G11B 5/59633 360/77.01 |
| 2009/0168227 A1* | 7/2009 | Blaum | G11B 5/59688 360/77.05 |
| 2009/0313426 A1* | 12/2009 | See | G06F 3/0613 711/112 |
| 2010/0053796 A1* | 3/2010 | Boyle | G11B 5/09 360/75 |
| 2013/0117520 A1* | 5/2013 | Ryu | G06F 12/02 711/165 |
| 2016/0162208 A1* | 6/2016 | Cai | G06F 11/1016 711/103 |
| 2017/0169846 A1* | 6/2017 | Abe | G11B 5/59627 |
| 2017/0220473 A1 | 8/2017 | Feist et al. | |

\* cited by examiner

REDUCED LATENCY I/O IN MULTI-ACTUATOR DEVICE

BACKGROUND

Data stored on magnetic disks may degrade over time due to various phenomena such as side track erasure (STE), adjacent track interference (ATI), tribological issues such as lube depletion or deposition, magnetic stress defects due to media grain thermal instability, and other magnetic disk reliability phenomena. Some storage devices regularly perform certain processing and media operations, background or foreground, to monitor these and other phenomena that may lead to loss of data. For example, a storage device controller may regularly read back data tracks or track segments to measure degradation of stored data. In general, a small degree of data degradation may be acceptable if the data is still recoverable via an error correction code (ECC) of the storage device. However, if the degradation becomes too severe, the ECC may be unable to repair the data. To prevent unacceptably high loss of data reliability storage device controllers may implement firmware operations for refreshing (e.g., re-writing) data.

In some devices, data refresh operations entail reading and re-writing logical block address ranges that may span contiguous sets of adjacent data tracks. In some of these devices, a group of data tracks is refreshed by moving the data of an LBA range (an extent) to a new storage location and updating a physical-to-logical block mapping scheme to remap the logical block addresses (LBAs) of the data to the new location. In other implementations, a data refresh is performed by moving data from a main store to a temporary non-volatile cache (e.g., a media cache) location and then reading the data out of the non-volatile cache and writing the data back to the main store location.

When a group of data is moved from one physical location to another, as in either of the above-described data refresh techniques, an actuator arm may be moved some number of times back and forth between the locations to complete a single refresh operation. This excessive movement of the actuator arm contributes to high latencies and reduced device performance during these refresh operations.

SUMMARY

Implementations disclosed herein provide systems and methods for increasing input/output operations per second in a multi-actuator device. According to one implementation, a data access operation disclosed herein provides for reading data into volatile memory from a first storage region using a read element controlled by a first actuator assembly; and writing the data from the volatile memory to a second storage region using a write element controlled by a second actuator assembly, the first actuator assembly and the second actuator assembly being configured to receive data from control circuitry via independent read/write communication channels.

According to another implementation, another type of data access operation disclosed herein includes detecting a power down event and flushing metadata from volatile memory to redundant storage locations responsive to the detection of the power failure, each one of the redundant storage locations being readable and writable by a different actuator assembly configured to receive data from control circuitry along an independent read/write communication channel.

According to yet another implementation, a method disclosed herein provides for analyzing performance-based criteria associated with each of multiple independently-controllable actuator assemblies available to execute a data access operation and selecting an actuator assembly to execute the data access operations based on the performance-based criteria.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

DETAILED DESCRIPTION

The herein disclosed data management schemes reduce latencies associated with writing data in multi-actuator devices by leveraging the availability of different read/write communication channels for different actuator assemblies. In one implementation, the disclosed methodology provides for a write refresh operation that entails reading data from a storage location on a first disk surface and writing data to a storage location on a different disk surface, where the read and write operations are performed by different, independently-controllable actuator assemblies. When a data refresh is performed according to such techniques, data is transmitted through control electronics from one actuator assembly to another, but the data refresh can be completed without repeated radial movements (seeks) of a single actuator arm between the locations that data is read from and migrated to. This significantly reduces the duration of each data refresh operation, which in turn translates to a perceived increase in device performance to a user.

In still other implementations, the disclosed methodologies facilitate latency reduction in other types of write operations, such as operations to move valid cache data to overwrite stale data in corresponding main store locations and/or to redundantly write valid data to multiple non-volatile memory locations, either as part of a refresh (e.g., updating a metadata file) or other redundant data write scenario. In one implementation, redundantly-stored data is directed to storage locations accessed by different actuator assemblies to facilitate parallel (simultaneous) writes to the multiple different locations by transmitting the data along different read/write actuator communication channels. These and other example implementations are discussed further below.

Figure 1:
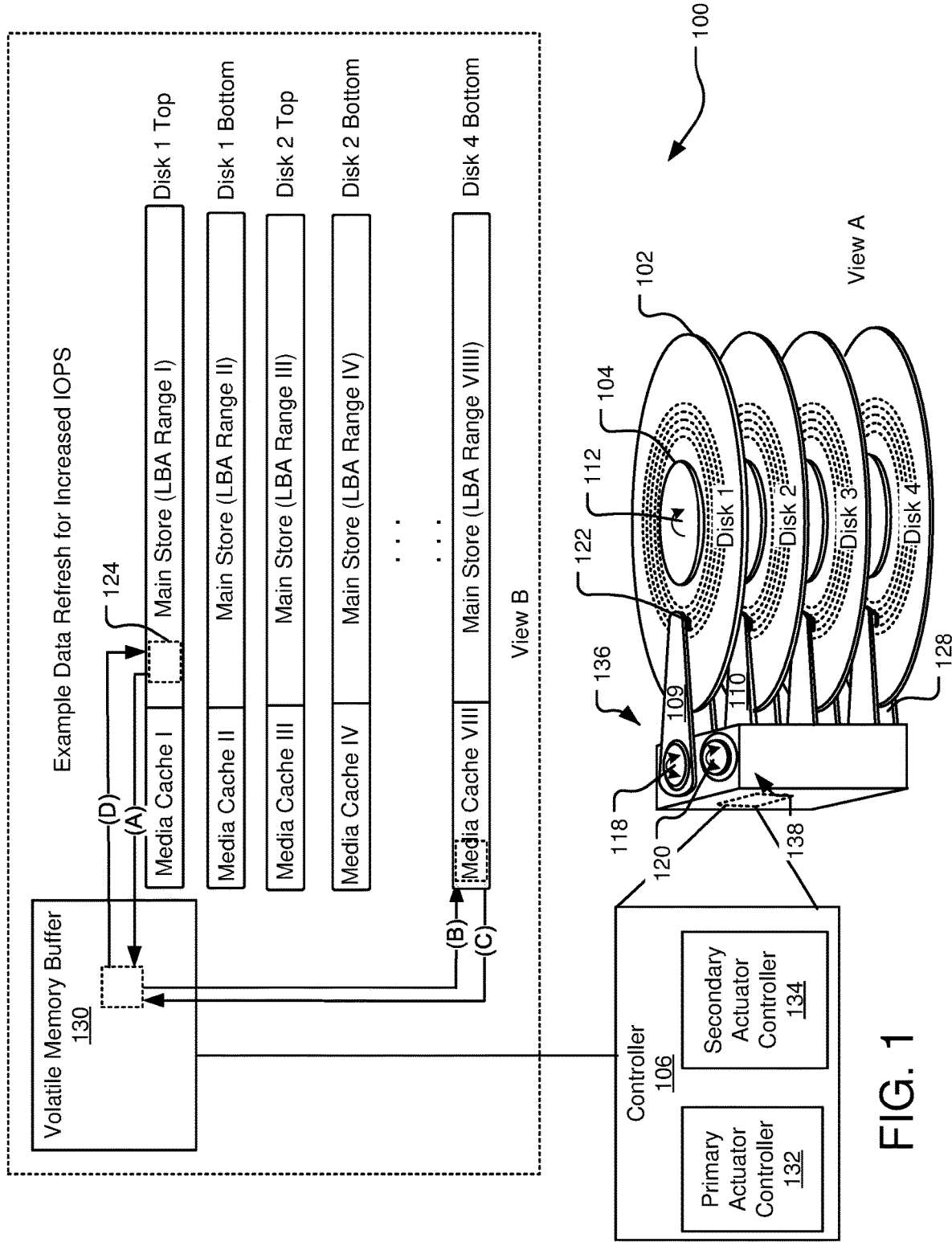
FIG. 1 illustrates an example storage device that leverages the availability of different read/write data channels for different actuators to increase in the number of input/output operations per second (IOPS) when migrating data as part of a data refresh operation.

FIG. 1 illustrates an example storage device 100 that leverages the availability of different actuator assembly data channels in order to increase the number of input/output operations per second (IOPS) when migrating data as part of a refresh operation. In different implementations, the storage device 100 may assume a wide variety of different forms. The storage device 100 includes at least one magnetic storage medium and is, in FIG. 1, shown to include four magnetic storage disks—Disk 1, Disk 2, Disk 3, and Disk 4—on which data bits can be recorded using a magnetic write pole (not shown) and from which data bits can be read using one or more magnetoresistive elements (not shown).

Each of the various magnetic storage media of the storage device 100 rotates about a spindle center or a disc axis of rotation 112 during rotation, and includes an inner diameter (e.g., an inner diameter 104) and an outer diameter (e.g., an outer diameter 102) between which are a number of concentric data tracks. The storage device 100 includes at least two independently-operable actuator assemblies that each control movement of one or more actuator arms to position various read/write elements over target storage locations for read and write operations of the storage device. In FIG. 1, the storage device 100 is shown to include a first actuator assembly 136 that rotates about a first axis of rotation 118 to effect uniform radial movement of a first subset of actuator arms (e.g., an actuator arm 109), such as actuator arms for accessing upper lower surfaces of disk 1 and disk 2. A second actuator assembly 138 rotates about a second different axis of rotation 120 to effect uniform radial movement of a second subset of actuator arms, such as actuator arms for accessing upper and lower surfaces of disks 3 and 4. Each of the different independently-controllable actuator assemblies is controlled to rotate about the associated axis of rotation 118 or 120 by a different voice coil motor (not shown).

The storage device 100 includes controller 106 that includes a number of sub-controllers, including a primary actuator controller 132 and a secondary actuator controller 134. The primary actuator controller 132 transmits control signals to the VCM of the first actuator assembly 136 to effect rotation about the axis of rotation 118, while the secondary actuator controller 134 transmits control signals to the VCM of the second actuator assembly 138 to effect rotation about the axis of rotation 120.

Further, the primary actuator controller 132 and the secondary actuator controller 134 are each coupled to different respective data communication channels utilized during read/write operations of the storage media surfaces accessible by read/write elements of each respective actuator assembly 136 and 138. For example, the primary actuator controller 132 transmits control signals and host data along a first communication channel to read data from and write data to disks 1 and 2, while the secondary actuator controller 134 transmits control signals and host data along a second communication channel to read data from and write data to disks 3 and 4.

In different implementations, the different independently-controllable actuator assemblies may be positioned differently than that shown. For example, the actuator assemblies may be located on opposing sides of a storage device enclosure rather than the same side as shown in FIG. 1. Likewise, the different independently-controllable actuator assemblies may be operable to control different numbers of actuator arms. For example, FIG. 2, discussed below, provides a detailed view of a storage device similar to the storage device 100 with two independently-controllable actuator assemblies that each control three actuator arms that pivot together about a same axis of rotation. Some implementations may include greater than two independently-controllable actuator assemblies (e.g., as in an example discussed below with respect to FIG. 4).

Each one of the different actuator arms in FIG. 1 (e.g., 109, 110) includes a mounted transducer head assembly (e.g., a transducer head assembly 122), which flies in close proximity relative to an adjacent surface of a rotating storage medium (e.g., an upper or lower surface of Disks 1-4). Further, each transducer head assembly includes at least one read element for reading data from the adjacent surface and at least one write element for writing data to the adjacent surface. In some implementations, an actuator arm may include pairs of read/write elements configured to access different storage media surfaces. For example, the actuator arm 110 may include a first pair of read/write elements configured to access a lower surface of Disk 1 and a second pair of read/write elements configured to access an upper surface of Disk 2.

During a seek operation, one of the actuator controllers (either the primary actuator controller 132 or the secondary actuator controller 134) rotates its actuator arms about the associated axis of rotation (118 or 120) to position a transducer head assembly over a target data track for a read or write operation of the storage device 100. Over time and with repeated writes, data stored on the various storage media (Disks 1-4) may become degraded, such as due to ATI or STE. The controller 106 implements operations to monitor for and periodically correct data degradation by implementing data refresh operations.

The manner in which the controller 106 implements each data refresh operation is implementation-specific and may depend on factors such as the type of mapping scheme utilized (e.g., dynamic or static logical block address (LBA) mapping) as well as the physical layout of user data storage space and the locations of one or more non-volatile cache regions (if any).

In the example of FIG. 1, the storage space of the disks (1-4) is shown mapped to logical block addresses (LBAs) of a host device according to a static LBA mapping scheme. The total logical block address space utilized by the host is mapped across a range of physical blocks collectively referred to herein as a main store. Specifically, each of disks 1-4 includes a top surface and a bottom surface with physical storage areas included within the main store. Each surface of each disk also includes an overprovisioned cache region, referred to herein as a media cache. A media cache includes physical data blocks that are excluded from the main store and instead used by the controller 106 as temporary writing areas to help maintain data integrity during read and write operations and/or otherwise improve device performance.

In the illustrated example, each surface of each disk 1-4 includes a designated media cache region, for a total of eight media cache regions spread across eight media surfaces of the disks 1-4 in the storage device 100. The illustrated layout of main store regions and media cache regions is intended to exemplify one of many storage layouts in which the herein disclosed techniques can be utilized to increase IOPS of a data refresh operation. Other implementations of the technology may include media cache regions on fewer than all disks and/or disks surfaces, and still other implementations may provide for data refresh that occurs without utilizing media cache.

In some conventional systems, degraded data may be refreshed by copying data of one or more tracks on a disk surface to a media cache on the same disc surface. In an example conventional data refresh of this type, data from a physical band of main store data tracks on the top surface of Disk 1 (within the main store LBA range I) is migrated to the media cache I. After this migration, the data is migrated back to locations within the same physical band of main store data tracks on the top surface of disk I. Temporarily storing the data in the media cache in this way protects the data from irreparable corruption that may occur in the event that a power failure occurs during the write to the physical band of main store data tracks.

In the above-described conventional system refresh of degraded data, migrating data between the main store and media cache regions on a same disk surface (e.g., the top surface of disk 1) may entail multiple seeks of the actuator arm 109 between the main store and media cache regions on the same disk surface. This is, for example, due to the fact that a volatile buffer may not be large enough to store all data of a refresh operation at once. In this case, data may be copied from the main store to the media cache, and back again, in a series of data chunks. As a result, migrating data from a physical data band (e.g., data of a consecutive range of LBAs within LBA range I) to the media cache I (also on the top surface of disk 1) may entail reading a first chunk from the main store, moving the actuator arm 109 into position for a media cache write, writing the first chunk to the media cache, moving the actuator arm 109 into position for a main store read, reading a second chunk of the data from the main store, moving the actuator arm 109 into position for a media cache write, and so on, back and forth until each chunk of the data in the band has been copied to the media cache. The reverse process may then be repeated to move the data from the media cache back to the physical data band in the main store.

When the above-described methodology is utilized for each data refresh operation, the total time for completing the refresh can be understood as follows:

$$\sum_{n=0}^{m} Rn + Swn + Wn + Srn \quad (1)$$

where 'm' is the total number of data chunks to be migrated into the media cache, Rn is the time to read data for each data chunk, Swn is the time to seek to the write location for each chunk, Wn is the time to write data for each chunk, and Srn is the time to seek back to the read location for the next chunk. Here, the seek times (Swn and Srn) are heavy contributors increasing the length of the total time interval for the data refresh.

According to one implementation, the controller 106 of the storage device 100 implements a data refresh operation via a series of steps that includes reading data from a source region with a read element controlled by a first actuator assembly and writing the read data to a target region with a write element controlled by a second actuator assembly. In one implementation, the source region and the target region are both main store storage regions of a storage device that implements a dynamic mapping scheme. In other implementations (such as that shown in FIG. 1), the source region is a main store region and the target region is a media cache location. The controller 106 effectively pairs data channels of the primary actuator controller 132 and the secondary actuator controller 134 by directing transient LBAs through device circuitry to allow the data to be migrated between the source region and the target region during the refresh.

One particular example of a data refresh that leverages the availability of different actuators and their associated read/write communication channels to improve system performance is shown in view B of FIG. 1. In this example, the controller 106 has identified a region 124 on a top surface of disk 1 as satisfying certain predefined refresh criteria. For example, some of the data in the region 124 may have degraded to a point that a read of this region yields a bit error rate above a set threshold.

In one implementation, the region 124 is a band of shingled or interlaced magnetic recording tracks that are updated as a single unit. In this case, all tracks within a same data band may be updated if even one track within the data band satisfies the refresh criteria. Alternatively, the region 124 may be a grouping of tracks in a conventional magnetic recording device that are refreshed as a unit so as to reduce fragmentation in the region. In still other implementations, the region 124 includes a single track or part of a single track. For example, the region 124 may include an individual data sector or other parity-protected region that is cached in non-volatile memory during an update to ensure the data is recoverable in the event of power failure or write error.

Responsive to determining that the region 124 satisfies the predefined refresh criteria, the controller 106 determines that the region 124 is accessible by (e.g., readable and writeble by) a transducer head assembly 122 of the first actuator assembly 136, which is controlled by the primary actuator controller 132. The controller 106 then selects a media cache location (the target region) that is accessible by read/write elements of the second actuator assembly 138, which is controlled by the secondary actuator controller 134. In the illustrated example, the target region is selected as being a location within a region (media cache VIII) on the bottom surface of Disk 4. This target region is accessible by a transducer head assembly (not shown) mounted on the actuator arm 128, which is coupled to a read/write communication channel of the secondary actuator controller 134.

The controller 106 effectively pairs the transducer head assemblies located on actuator arms 109 and 128 as well as their associated communication channels for the duration of the refresh operation, allowing data that is read using a read/write communication channel of the primary actuator controller 132 to be written to the target media cache location using the read/write communication channel of the secondary actuator controller 134, if possible via a Direct Memory Access (DMA) operation.

To execute the data refresh of the region 124, the primary actuator controller 132 transmits control signals to the transducer head assembly 122 to initiate a reading of data from the region 124. Data read from the region 124 is transmitted along a first read/write communication channel and stored in a volatile memory buffer (as shown by step (A) in FIG. 1). Upon arrival in the volatile memory buffer 130, the secondary actuator controller 134 then accesses the volatile memory buffer 130 and transmits the data along a second read/write communication channel to a write element on the actuator arm 128 (as shown by step (B) in FIG. 1).

This transfer of data along the various communication channels of the device electronics facilitates the copying of the data from the region 124 to the media cache VIII without multiple back-and-forth seek operations of an individual actuator arm. For example, the data of the region 124 may be read into the volatile memory buffer 130 without executing any radial seeks of the actuator arm 109 except for normal track-to-track switches that occur as part of a sequential read operation.

After the data of the source region (the region 124) is read into target region (the media cache VIII), the secondary actuator controller 134 initiates a read operation of the data back out of the target region and along the second communication channel into the volatile memory buffer 130 (as shown by step C in FIG. 1). The primary actuator controller 132 then initiates a write operation that transmits the data back along the first read/write communication channel to the source region (as shown by step D in FIG. 1).

As a consequence of executing the data refresh in this way (e.g., via steps A, B, C, and D), the total data refresh time provided by equation (1) above is reduced by the elimination of the seek times (Swn and Srn). Since the primary actuator controller 132 and the secondary actuator controller 134 may perform encoding and decoding actions, this methodology may introduce a validation delay (during which time the data is encoded or decoded). However, validation delay is relatively small in comparison to the seek times that are eliminated. For example, seek times may be roughly 1000 times typical decoder delay and roughly 100 times typical write validation delay.

As discussed above, a data refresh of degraded data may entail a migration from one non-volatile location to another. In other scenarios, however, a data refresh operation is performed to update stale (invalid) data residing in the main store rather than to correct degraded data. For example, a device cache (volatile or nonvolatile) may store a version of data that is more current than corresponding data stored in the main store. In this case, the stale main store data may be refreshed via an overwrite of the valid data from the device cache. In the event that the cache is a non-volatile cache, the steps may be the same or similar to those described above with respect to FIG. 1.

In other implementations, however, the valid data may reside exclusively in a volatile cache rather than a non-volatile cache. For example, the valid data may be a metadata table that is routinely maintained and updated in volatile memory and written redundantly to one or more target regions in non-volatile memory (overwriting the stale data) when the storage device powers down. If the redundant data storage locations (e.g., the target regions for the refresh) are selected to be regions accessible via different read/write communication channels and different actuator assemblies, the refresh can be executed as a series of parallel (simultaneous) writes along the different read/write communication channels, reducing a total time for the refresh as compared to systems where the same actuator assembly is utilized to write two or more instances of the same redundant data. An example of this implementation is discussed in greater detail with respect to FIG. 3, below.

Figure 2:
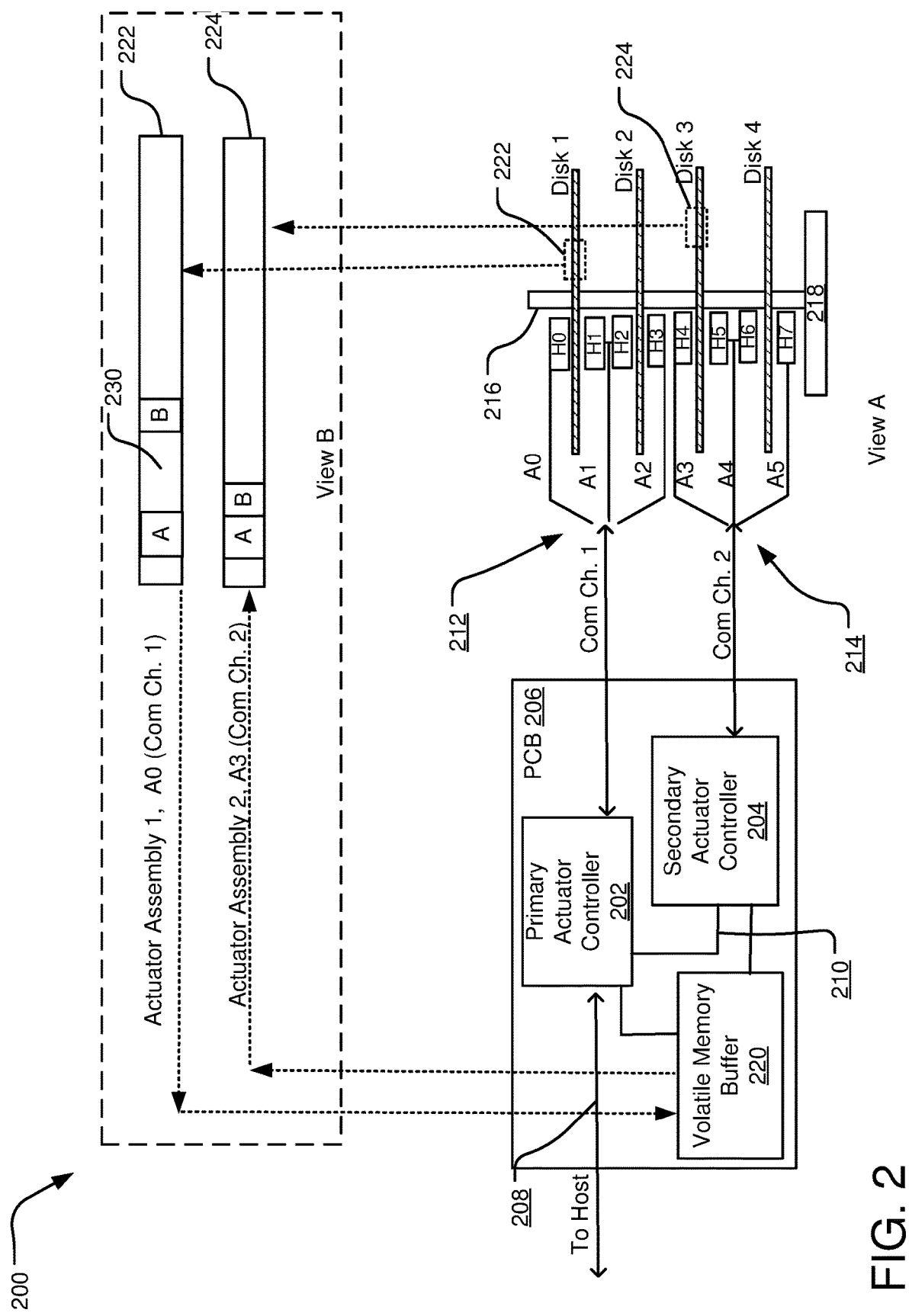
FIG. 2 illustrates another example storage device that leverages the availability of different read/write communication channels for different actuators to increase IOPS when migrating data as part of a refresh operation.

FIG. 2 illustrates another example storage device 200 that leverages the availability of different read/write communication channels for different actuator assemblies to increase a rate of input/output operations per second when migrating data as part of a refresh operation. The storage device 200 includes control circuitry (e.g., primary actuator controller 202 and a secondary actuator controller 204) mounted on a printed circuit board (PCB) 206. The primary actuator controller 202 is configured to communicate with a host device across a host interface 208 and also configured to communicate with the secondary actuator controller 204 across a control interface 210. In the illustrated example, the secondary actuator controller 204 communicates with the host through the primary actuator controller 202. In one implementation, the host interface 208 and the control interface 210 are SAS connections.

The primary actuator controller 202 controls a first voice coil motor (not shown) operational to rotate a trio of actuator arms (A0, A1, and A2) together about a first actuator assembly 212. The secondary actuator controller 204 controls a second voice coil motor (not shown) that is operational to rotate another trio of actuator arms (A3, A4, and A5) together about a second actuator assembly 214. Each of the actuator arms A0, A1, A2, A3, A4, and A5 includes at least one transducer head assembly for reading and writing data to an associated surface of one of four disks (labeled Disk 1, Disk 2, Disk 3, and Disk 4, respectively) that are rotated about an axis 216 by a spindle motor 218. For example, the actuator arm A0 supports a transducer head assembly H0 that is controlled by the primary actuator controller 202 to read and write data to a top surface of Disk 1, while the actuator arm A1 supports two transducer head assemblies H1 and H2 to read and write data to a lower surface of Disk 1 and a top surface of Disk 2, respectively.

The PCB 206 includes a volatile memory buffer 220 (e.g., DRAM, SRAM, or other type of RAM) that is jointly accessible by both the primary actuator controller 202 and the secondary actuator controller 204.) The primary actuator controller 202 receives and transmits data and data commands to the first actuator assembly 212 across a first read/write communication channel (Com Ch. 1), while the secondary actuator controller 204 receives and transmits data and data commands to the second actuator assembly 214 across a second read/write communication channel (Com Ch. 2). During a data refresh operation of the storage device 200, data is transmitted between the two actuator controllers 202 and 204 via the first and second read/write communication channels and the volatile memory buffer 220.

During normal read/write operations of the storage device 200, control circuitry (e.g., the primary actuator controller 202, the secondary actuator controller 204, or other control software and/or hardware components) monitor data degradation of data stored on each of the disks, such as by periodically reading back data to determine an associated bit error rate. In one implementation, the primary actuator controller 202 takes actions to monitor data degradation and refresh data on Disk 1 and Disk 2, while the secondary actuator controller 204 takes actions to monitor data degradation and refresh data on Disks 3 and 4. When the bit error rate of one or more tracks in a data band exceeds threshold, the associated actuator controller (202 or 204) initiates a data refresh operation to refresh (rewrite) the data of the first region 222, which may include a range of LBAs spanning multiple data tracks.

View B of FIG. 2 illustrates an example full or partial data refresh operation whereby data of a first region 222 on a top surface of Disk 1 is migrated (copied) to a second region 224 on a top surface of disk 3. In this example, the primary actuator controller 202 has identified the first region 222 as satisfying certain predefined refresh criteria. For example, the data in the first region 222 may have degraded to a point that a read of this region yields a bit error rate above a set threshold. In response to this determination, the primary actuator controller 202 communicates with the secondary actuator controller 204 to select a target region on one of the associated surfaces of Disk 3 and 4 for receiving a copy of data from the region 222.

In one implementation (such as that discussed with respect to FIG. 1), the target region is a media cache. In another implementation, however, the target region is a main store location that is available to receive the data. For example, the target region may be a main store location in certain types of storage devices that implement dynamic LBA mapping schemes and implement a data refresh by remapping and moving a block of data from one main store location to another.

To select the target region for receiving a copy of the data of the region 222, the primary actuator controller 202 may provide the secondary actuator controller 204 with information such as the size of the data write and, in some implementations (such as those implementing dynamic LBA mapping schemes), the LBA range associated with the region 222. With this information, the secondary actuator controller 204 identifies various locations available to receive the data. In some implementations with more than two actuator assemblies, the various actuator controllers may evaluate a current state and/or workload of the actuator assemblies to select the target storage location. This scenario is discussed further with respect to FIG. 4, below.

In the illustrated example, the secondary actuator controller 204 selects the second region 224 on a top surface of disk 3 as the target region for the data refresh and configures the second actuator assembly 214 for a write operation to the selected target region, such as by seeking the corresponding actuator into a track start position for the write. The primary actuator controller 202 moves the actuator arm A0 to align the transducer head assembly H0 with the first region 222 that is to be refreshed. Once the head H0 is in position, the primary actuator controller 202 begins reading LBAs from the first region 222 across the first communication channel (Com. Ch. 1) and into the volatile memory buffer 220.

In the illustrated implementation, the first region 222 stores two continuous LBA ranges A and B that are stored in contiguous regions that are non-contiguous with one another (e.g., an intervening region 230 stores stale data). The transducer head H0 reads the data of LBAs A and B into the volatile memory buffer in quantized units, referred to herein as chunks, that are of suitable size to fit within the volatile memory buffer 220. Responsive to the reading of each chunk of data into the volatile memory buffer 220, the secondary actuator controller 204 retrieves and transmits the data chunk along the second read/write communication channel (Com. Ch. 2) to the transducer head assembly H4 on actuator arm A3, which in turn writes the data chunk sequentially to the second region 224, as shown in View B.

In one implementation, the second region 224 (e.g., the target region of the data write) is a media cache. In this case, the refresh operation may further entail writing the data from the second region 224 back to the first region 222 (as in the example discussed with respect to FIG. 1). In another implementation, the target region 224 is part of main store of the storage device 200. In this case, the LBA ranges A and B may be remapped to the second region 224 and the data may reside there until the data is refreshed again.

In some implementations, a non-volatile memory source may be utilized in lieu of or in addition to the volatile memory buffer 220. For example, the primary actuator controller 202 and the secondary actuator controller 204 may each have access to a solid-state device (e.g., Flash) where data is written to by the first actuator controller 202 and read from by the second actuator controller 204 during a refresh operation.

Figure 3:
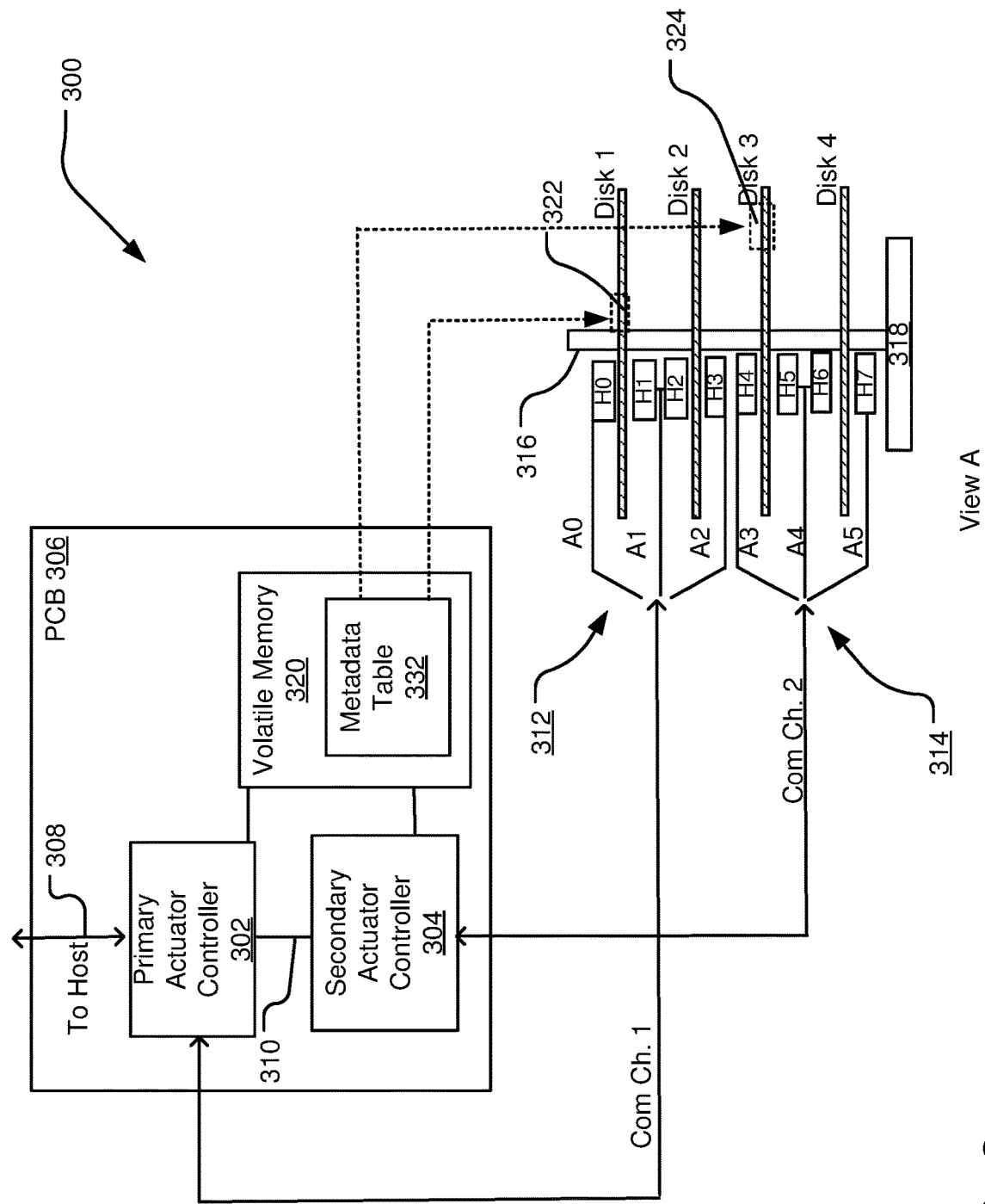
FIG. 3 illustrates an example storage device that leverages the availability of different read/write communication channels for different actuators to increase in IOPS when copying redundantly-stored data to multiple non-volatile memory locations.

FIG. 3 illustrates an example storage device 300 that leverages the availability of different read/write communication channels for different actuator assemblies to increase IOPS when copying redundantly-stored data to multiple non-volatile memory locations. The storage device 300 includes control circuitry (e.g., a primary actuator controller 302 and a secondary actuator controller 304) mounted on a printed circuit board (PCB) 306. The primary actuator controller 302 controls a first voice coil motor (not shown) to rotate a trio of actuator arms (A0, A1, and A2) in unison about a first actuator assembly 312, while the secondary actuator controller 304 controls a second voice coil motor (not shown) to rotate another trio of actuator arms (A3, A4, and A5) in unison about a second actuator assembly 314. Each of the actuator arms A0, A1, A2, A3, A4, and A5 includes at least one transducer head assembly for reading and writing data to an associated surface of one of four disks (labeled Disk 1, Disk 2, Disk 3, and Disk 4, respectively) that are rotated about an axis 316 by a spindle motor 318.

The PCB 306 includes volatile memory 320 (e.g., DRAM) that is mutually accessible by each of the primary actuator controller 302 and the secondary actuator controller 304. During operation of the storage device 300, one or more metadata tables (e.g., a metadata table 332) are maintained and updated in the volatile memory 320. For example, the metadata table 332 may be include a logical-to-physical block mapping that is loaded into volatile memory upon power-up and flushed back to one or more non-volatile memory locations upon power down.

In one implementation, the metadata table 332 is a system information file (SIF) that is redundantly stored in multiple non-volatile locations (e.g., redundant storage locations 322 and 324). The metadata table 332 is loaded into the volatile memory 320 when the storage device 300 powers on and is flushed back to the redundant storage locations 322 and 324 each time the storage device 300 powers down. The redundant storage locations 322 and 324 are intentionally selected to reside on different storage media surfaces that are accessible by the different actuators 312, 314 under control of the corresponding different actuator controllers 302 and 304. For example, the redundant storage locations 322 and 324 may be dynamically selected at the time of that the flush of the volatile memory 320 is initiated or preselected during manufacturing and/or initialization of the storage device 300. If the redundant storage locations 322 and 324 are used to store the metadata table 332 on an ongoing basis (throughout multiple power-up/power-down cycles), each flush of the metadata table 332 from the volatile memory 320 refreshes stale data residing in the target regions.

Since the data writes to each of the redundant storage locations 322 and 324 can be executed in parallel along the read/write communication channel (Com. Ch. 1) of the primary actuator controller 302 and the read/write communication channel (Com. Ch. 2) of the secondary actuator controller 304, the writes can be performed simultaneously, reducing a total time duration of the offload.

Figure 4:
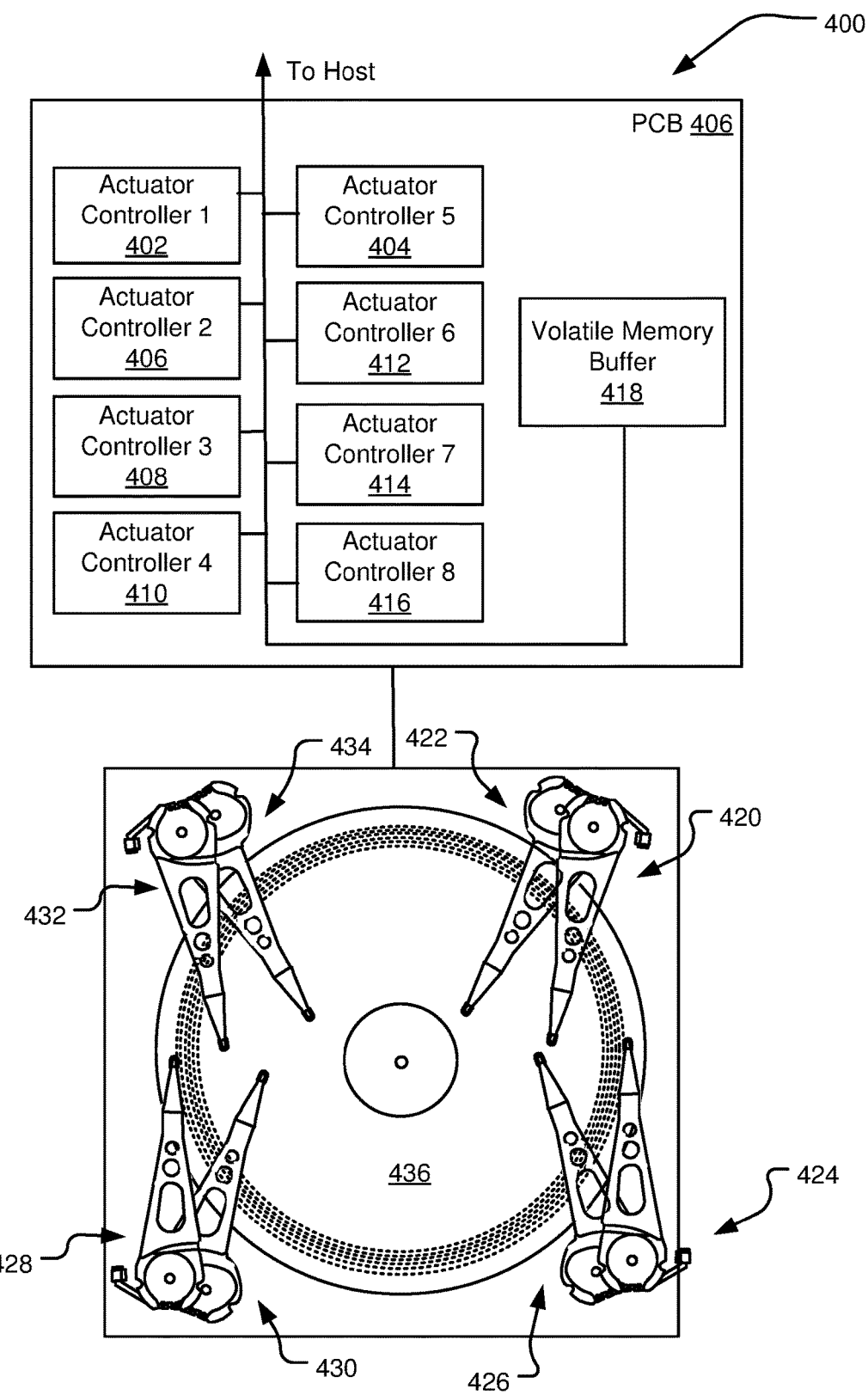
FIG. 4 illustrates another example storage device that leverages the availability of different read/write communication channels to increase IOPS when performing a refresh operation.

FIG. 4 illustrates another example storage device 400 that leverages the availability of different read/write communication channels to increase IOPS when performing a refresh operation. The storage device 400 includes eight different independently-controllable actuator assemblies (e.g., 420, 422, 424, 426, 428, 430, 432, 434, 436), with two of the actuator assemblies positioned in each of four quadrants of a casing of the storage device 400. Each of the eight independently-controllable actuator assemblies is operational to control a voice coil motor that moves one or more actuator arms about an axis.

The storage device 400 includes a number of different storage media (e.g., stacked below a disk 436) that are writable to by various read/write elements supported by the different actuator arms. Further, the storage device 400 includes eight different actuator controllers (e.g., 402, 404, 406, 408, 410, 412, 414, and 416), each including software and/or hardware for managing read and write operations (e.g., transmitting control signals and data, managing LBA to physical block mappings) effected by read/write elements of an associated one of the eight actuator assemblies. Each one of the actuator controllers is configured to transmit analog control signals to the associated actuator assembly along an independent read/write communication channel. Thus, the storage device 400 of FIG. 4 includes eight read/write communication channels, each extending between one of the eight actuator assemblies and the associated actuator controller.

In various implementations, the different actuator controllers may be coupled to one another, a host device, and one or more memory resources (e.g., a volatile memory buffer 418) in a variety of different ways and according to a variety of available communication protocols.

During one example write operation (either a refresh operation or other type of data write), data is copied from a source region to one or more target regions (e.g., more than one target region if the data is stored redundantly). The storage device 400 dynamically selects the target region(s) and/or one or more target actuator assembl(ies) for executing the write operation. These selections may be based on characteristics of the various actuator assemblies (e.g., 420, 422, 424, 426, 428, 430, 432, 434, 436) and their associated data channels.

In one implementation, the source region is a non-volatile cache. During the data write, data is moved from the non-volatile cache (e.g., a disk-based or solid state memory cache) to corresponding main store locations. This may occur, for example, during a cache cleaning process or during a refresh operation of the type explained with respect to FIG. 1. In another implementation, the source region and the target regions are both main store regions, such as when data is refreshed in a device implementing a dynamic LBA mapping scheme. In still other implementations, the source region is volatile memory and the target region(s) are in non-volatile memory. For example, the write operation may transfer data from a volatile DRAM or back-EMF protected DRAM to a non-volatile cache or to a main store location.

When any of the above write operations are executed in a multi-actuator system such as the system shown and described with respect to FIG. 4, executing the data write may entail a selection of one or more target actuator assemblies based on the characteristics of those assemblies and associated performance-based criteria. As used herein, "performance-based criteria" generally pertains to criteria affecting IOPS of a data access operation, latency, and/or bit error rate (BER). Example performance-based criteria include without limitation read/write channel status (e.g., active v. idle), read/write channel workload, access latency (e.g., rotational latency, seek time, and settle time), and reliability criteria such as characteristics of read/write elements and/or physical media as evidenced by write history such as past history of writes in an energy assisted system and/or writes to the target surface and location.

If, for example, the target region(s) are not dynamically selectable at the time of the data write (e.g., as in a cache cleaning process that transfers cache data to corresponding main store locations), the storage device may determine whether the target region(s) are accessible by more than one of the different actuator assemblies. In the event that a target region is accessible by more than one of the actuator assemblies, the storage device 400 implements performance-based logic to select one or more target actuator assemblies for executing the data write.

Alternatively, if the target regions are dynamically selectable at the time of the data write (e.g., as in a selection of multiple distributed cache locations), the storage device 400 may implement performance-based logic that includes (1) selecting one or more target actuator assemblies; and (2) selecting one or more target region(s) from the storage space that is available and/or accessible by the selected target actuator assemblies.

To select a target actuator assembly for executing a particular write operation, the various actuator controllers may communicate various information with one another including without limitation information pertaining to current activity level, channel workload, read/write head characteristics, past history of internal and external work, and other considerations.

In one implementation, a target actuator assembly is selected for a write operation based on the current activity level of the various actuator assemblies in the system and/or activity level of those individual actuator assemblies configured to access a target region (e.g., if the target region is static). For example, one of the actuator assemblies may be identified as having an inactive or currently idle channel status and, consequently, selected as a target actuator assembly. In some cases, the selection of the target actuator assembly may further include determining a power state of each of the actuator assemblies. Since some lower power states can take longer to recover from (e.g., to wake up), selecting the target actuator assembly may entail selecting one of the actuator assemblies that is determined to be idle and in the power state which is fasted to recover from. In the case that the target region(s) are static, this selection of the target actuator assembly is limited to those target actuator assemblies that are configured to access the target region(s). In cases where the target region(s) are dynamically selectable, the storage device 400 may select the target region actuator controller and subsequently select one or more target regions from those accessible to the target region actuator controller.

In another implementation, the actuator controllers communicate channel workload information, and the target actuator assembly is selected based on an assessment of the current workload for each of the actuator assemblies. For example, an actuator assembly having a controller with a lowest number of pending high priority I/O commands may be selected as the target actuator assembly. If target regions are dynamically selectable, those regions may be selected from available storage regions that are writable by the target actuator assembly.

In addition to or in lieu of workload or current activity level, the storage device 400 may, in some implementations, select target actuator assemblies and/or target regions(s) based on actuator position and/or access time. For example, available regions with the shortest access time may be identified and selected as target region(s). In the event that multiple actuators are configured to access one or more of the selected target region(s), a target actuator assembly may be selected, such as based on channel workload or activity status (as described above), or other information.

In still another implementation, the actuator assemblies for the data write are selected based on reliability criteria for the associated read/write elements, such as by selecting an actuator assembly having read/write elements with a lowest write power on hours (WPOH). Still further implementations utilize a combination of the above-mentioned considerations (e.g., one or more of actuator position, current workload, activity level, and reliability) to select the target actuator assembl(ies) and/or target regions for the data write.

In the event that the data write is part of a refresh that transfers data between two separate actuator channels (e.g., a read along one channel and a write along another channel), the data refresh operation may transfer data between channels by temporarily placing the data in a mutually-accessible memory source, such as the volatile memory buffer 418 or a non-volatile memory source (e.g., Flash), such as in accordance with methodology that is the same or similar as described above with respect to FIGS. 1-3.

Notably, FIG. 4 is meant to illustrate one example system with more than two actuator assemblies. It can be appreciated that the same or similar methodology may be applied (e.g., to select a target region to receive data read from disk or to select multiple target disk regions to receive redundant data) in a device having a different number of actuator assemblies.

Figure 5:
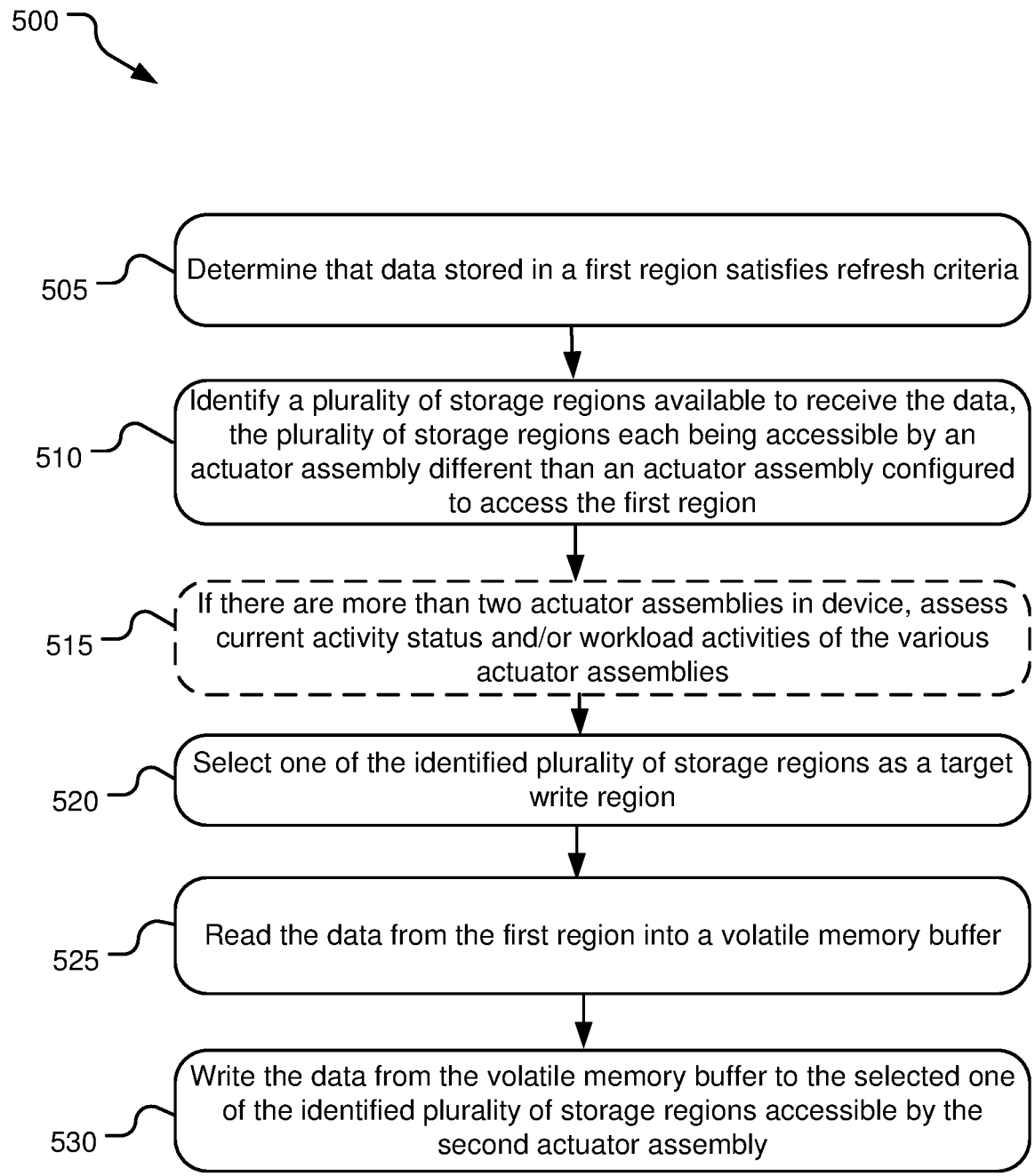
FIG. 5 illustrates example operations for leveraging different available read/write communication channels when refreshing data in a system that has multiple independently-controllable actuator assemblies.

FIG. 5 illustrates example operations 500 for leveraging different available read/write communication channels when refreshing data in a system that has multiple independently-controllable actuator assemblies. A determination operation 505 determines that data stored in a first region satisfies refresh criteria and initiates data refresh actions. An identifying operation 510 identifies a plurality of storage regions available to receive the data during the refresh operation. Each region of the identified plurality is accessible by an actuator assembly different than an actuator assembly configured to access the first region. For example, the first region is accessible by a first actuator assembly controlled along a first read/write communication channel and each of the identified regions are accessible by a second actuator assembly controlled along a second different read/write communication channel.

Optionally (e.g., if the storage device has more than two independently-operable actuator assemblies), an assessment operation 515 may assess a current activity status (e.g., idle/active) and workload activities (e.g., pending commands) of the various actuator assemblies in the device. A selection operation 520 selects at least one target storage region to receive the data during the refresh operation. The selected target storage region is a region accessible by an actuator assembly different than an actuator assembly configured to access the first region. In one implementation, the selection operation 520 is based on the assessment operation 515. For example, the selection operation 520 selects a target storage region that is accessible by one of the actuator assemblies that is inactive or that has a low number of pending high-priority commands.

A reading operation 525 reads the data from the first storage region into a volatile memory buffer and a writing operation 530 writes the data to the selected target storage region. Depending on the specific data management scheme employed, the refresh operation may or may not include additional steps. For example, the data may—in some implementations—be copied back from the target storage location (e.g., a media cache) to a source location (e.g., a main store location).

Figure 6:
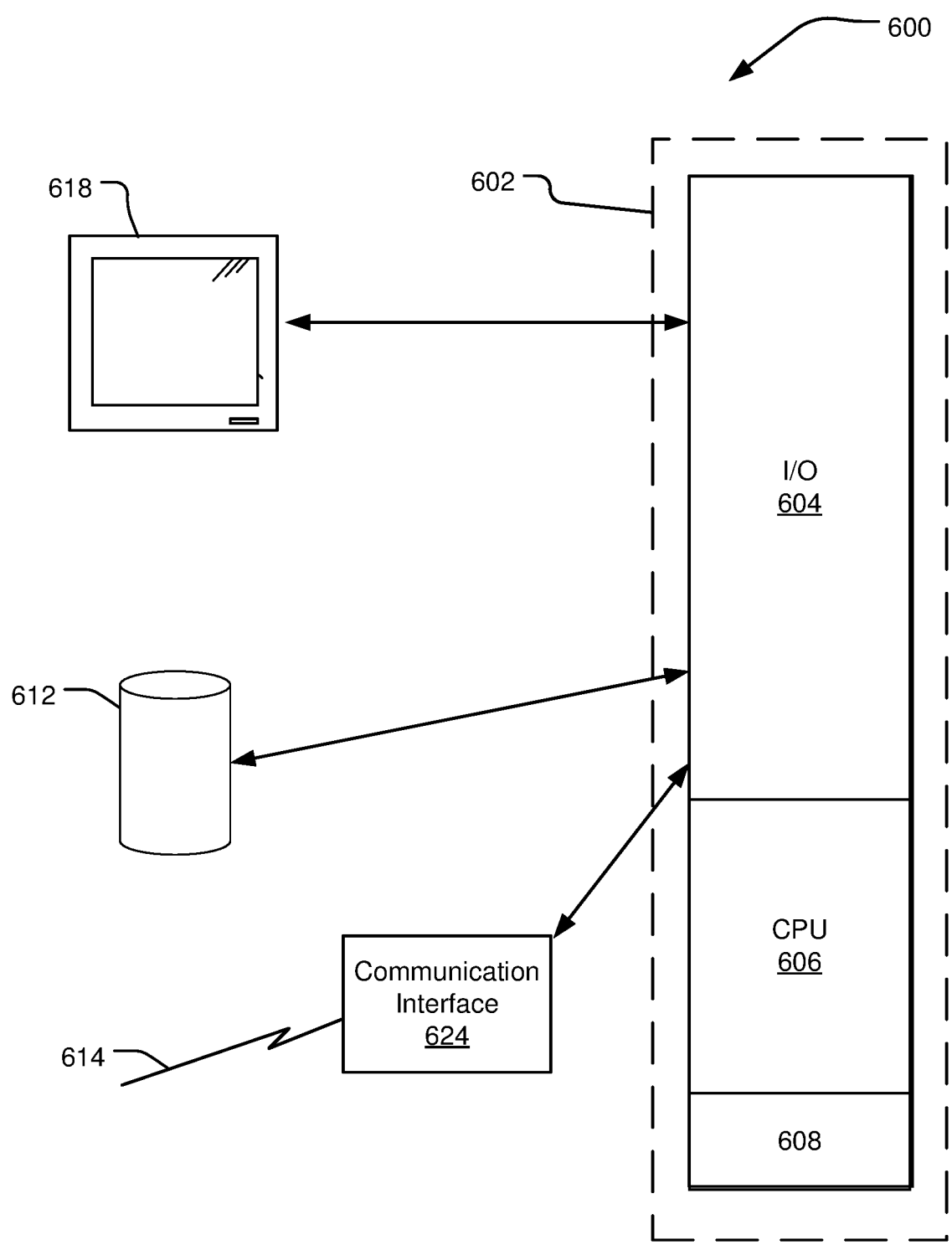
FIG. 6 illustrates an example processing system that may be useful in implementing the described technology.

FIG. 6 illustrates an example processing system 600 that may be useful in implementing the described technology.

The processing system 600 is capable of executing a computer program product embodied in a tangible computer-readable storage medium to execute a computer process. Data and program files may be input to the processing system 600, which reads the files and executes the programs therein using one or more processors (e.g., CPUs, GPUs, ASICs). Some of the elements of a processing system 600 are shown in FIG. 6 wherein a processor 602 is shown having an input/output (I/O) section 604, a Central Processing Unit (CPU) 606, and a memory section 608. There may be one or more processors 602, such that the processor 602 of the processing system 600 comprises a single central-processing unit 606, or a plurality of processing units. The processors may be single core or multi-core processors. The processing system 600 may be a conventional computer, a distributed computer, or any other type of computer. The described technology is optionally implemented in software loaded in memory 608, a storage unit 612, and/or communicated via a wired or wireless network link 614 on a carrier signal (e.g., Ethernet, 3G wireless, 5G wireless, LTE (Long Term Evolution)) thereby transforming the processing system 600 in FIG. 6 to a special purpose machine for implementing the described operations. The processing system 600 may be an application specific processing system configured for supporting the systems disclosed herein.

The I/O section 604 may be connected to one or more user-interface devices (e.g., a keyboard, a touch-screen display unit 618, etc.) or a storage unit 612. Computer program products containing mechanisms to effectuate the systems and methods in accordance with the described technology may reside in the memory section 608 or on the storage unit 612 of such a system 600.

A communication interface 624 is capable of connecting the processing system 600 to an enterprise network via the network link 614, through which the computer system can receive instructions and data embodied in a carrier wave. When used in a local area networking (LAN) environment, the processing system 600 is connected (by wired connection or wirelessly) to a local network through the communication interface 624, which is one type of communications device. When used in a wide-area-networking (WAN) environment, the processing system 600 typically includes a modem, a network adapter, or any other type of communications device for establishing communications over the wide area network. In a networked environment, program modules depicted relative to the processing system 600 or portions thereof, may be stored in a remote memory storage device. It is appreciated that the network connections shown are examples of communications devices for and other means of establishing a communications link between the computers may be used.

In an example implementation, a storage controller, and other modules may be embodied by instructions stored in memory 608 and/or the storage unit 612 and executed by the processor 602. In addition, keys, device information, identification, configurations, etc. may be stored in the memory 608 and/or the storage unit 612 and executed by the processor 602.

The processing system 600 may be implemented in a device, such as a user device, storage device, IoT device, a desktop, laptop, computing device. The processing system 600 may be a storage device that executes in a user device or external to a user device.

In addition to methods, the embodiments of the technology described herein can be implemented as logical steps in one or more computer systems. The logical operations of the present technology can be implemented (1) as a sequence of processor-implemented steps executing in one or more computer systems and/or (2) as interconnected machine or circuit modules within one or more computer systems. Implementation is a matter of choice, dependent on the performance requirements of the computer system implementing the technology. Accordingly, the logical operations of the technology described herein are referred to variously as operations, steps, objects, or modules. Furthermore, it should be understood that logical operations may be performed in any order, unless explicitly claimed otherwise or unless a specific order is inherently necessitated by the claim language.

Data storage and/or memory may be embodied by various types of processor-readable storage media, such as hard disc media, a storage array containing multiple storage devices, optical media, solid-state drive technology, ROM, RAM, and other technology. The operations may be implemented processor-executable instructions in firmware, software, hard-wired circuitry, gate array technology and other technologies, whether executed or assisted by a microprocessor, a microprocessor core, a microcontroller, special purpose circuitry, or other processing technologies. It should be understood that a write controller, a storage controller, data write circuitry, data read and recovery circuitry, a sorting module, and other functional modules of a data storage system may include or work in concert with a processor for processing processor-readable instructions for performing a system-implemented process The embodiments of the disclosed technology described herein are implemented as logical steps in one or more computer systems. The logical operations of the presently disclosed technology are implemented (1) as a sequence of processor-implemented steps executing in one or more computer systems and (2) as interconnected machine or circuit modules within one or more computer systems. The implementation is a matter of choice, dependent on the performance requirements of the computer system implementing the disclosed technology. Accordingly, the logical operations making up the embodiments of the disclosed technology described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the disclosed technology. Since many embodiments of the disclosed technology can be made without departing from the spirit and scope of the disclosed technology, the disclosed technology resides in the claims hereinafter appended. Furthermore, structural features of the different embodiments may be combined in yet another embodiment without departing from the recited claims.

What is claimed is:

1. A method of refreshing data on a storage media of a storage device, the method comprising:
   reading data into a volatile memory from a first storage region on a first surface of the storage media using a read element controlled by a first actuator assembly; and
   writing the data from the volatile memory to a second storage region on a second different surface of the storage media using a write element controlled by a second actuator assembly, the first actuator assembly and the second actuator assembly being configured to receive data from control circuitry via independent read/write communication channels, wherein the first storage region is within a main store region and the second storage region is within a cache.

2. The method of claim 1, wherein the main store region has a static physical to logical block mapping scheme.

3. The method of claim 2, wherein method further includes:
   reading the data from the second storage region back into the volatile memory; and
   writing the data from the volatile memory to the first storage region.

4. The method of claim 1, wherein the storage device includes multiple magnetic disks and multiple media cache regions distributed between the multiple magnetic disks, the second storage region being one of the multiple media cache regions residing on a different storage disk surface than the first storage region.

5. The method of claim 1, wherein the first storage region and the second storage region are both locations within a main store and the method further comprises:
   dynamically mapping physical blocks of the second storage region to logical block addresses of the data read from the first storage region.

6. The method of claim 1, wherein writing the data includes reducing fragmentation in the second region as compared to the first region.

7. The method of claim 1, wherein the second storage region is a dynamically-selected region.

8. The method of claim 7, wherein the storage device includes one or more actuator assemblies in addition to the first actuator assembly and the second actuator assembly and writing the data to the second storage region further comprises:
   selecting the second storage region as a target write location responsive to a determination that the second actuator assembly is inactive.

9. The method of claim 7, wherein the storage device includes one or more actuator assemblies in addition to the first actuator assembly and the second actuator assembly and writing the data to the second storage region further comprises:
   selecting the second storage region as a target write location responsive to a determination that the second actuator assembly is assigned fewer high priority currently-pending disk access commands than at least one other actuator of the storage device.

10. The method of claim 7, wherein the storage device includes one or more actuator assemblies in addition to the first actuator assembly and the second actuator assembly, and wherein writing the data to the second storage region further comprises:
    identifying a region associated with the shortest access time that is accessible by an actuator assembly different than the first actuator assembly used to read data from the first storage region; and
    selecting the identified region as a target write location.

11. The method of claim 7, wherein the storage device includes one or more actuator assemblies in addition to the first actuator assembly and the second actuator assembly, and wherein writing the data to the second storage region further comprises:
    selecting an actuator assembly based on reliability criteria; and
    writing the data to the second storage region with the selected actuator assembly.

12. The method of claim 1, further comprising:
reading the data;
determining that the read data has an associated bit error rate in excess of a predetermined threshold; and
reading the data from the first storage region in response to the determination.

13. A storage device comprising:
a first actuator controller adapted to control a first actuator assembly to read data from a first storage region on a first surface of a storage media into a volatile memory as a first part of a data refresh operation; and
a second actuator controller adapted to control a second actuator assembly to write the data from the volatile memory to a second storage region on a second different surface of the storage media as a second part of the data refresh operation, the first actuator assembly and the second actuator assembly being configured to receive data from control circuitry via independent read/write communication channels, wherein the first storage region is within a main store region and the second storage region is within a cache.

14. The storage device of claim 13, wherein the main store region has a static physical to logical block mapping scheme.

15. The storage device of claim 13, wherein the second actuator controller is further configured to read the data from the second storage region back into the volatile memory and the first actuator controller is further configured to write the data from the volatile memory to the first storage region.

16. The storage device of claim 13, wherein the storage device includes a multiple magnetic disks and multiple media cache regions distributed between the multiple magnetic disks, the second storage region being one of the multiple media cache regions residing on a different disk surface than the first storage region.

17. The storage device of claim 13, wherein the first storage region and the second storage region are both locations within a main store and the storage device is further configured to dynamically map physical blocks of the second storage region to logical block addresses of the data read from the first storage region.

18. The storage device of claim 13, wherein the second storage region is a dynamically-selected region.

19. The storage device of claim 13, wherein the storage device includes one or more actuator assemblies in addition to the first actuator assembly and the second actuator assembly and the second storage region is selected as a target write location responsive to a determination that the second actuator assembly is inactive.

20. The storage device of claim 13, wherein the storage device includes one or more actuator assemblies in addition to the first actuator assembly and the second actuator assembly and the second storage region is selected as a target write location responsive to a determination that the second actuator controller has fewer pending high priority currently-pending disk access commands than at least one other actuator controller of the storage device.

21. The storage device of claim 13, wherein the storage device includes one or more actuator assemblies in addition to the first actuator assembly, and wherein the second storage location is selected as a target write location responsive to a determination that the second storage region is associated with a shorter access time than at least one other region available to receive the data read from the first storage region.

22. The storage device of claim 13, wherein the storage device includes one or more actuator assemblies in addition to the first actuator assembly, and wherein the storage device is configured to select an actuator assembly based on reliability criteria and write the data to the second storage region using the select actuator assembly.

* * * * *